US 11,558,049 B2

(12) United States Patent
Yamashiro et al.

(10) Patent No.: US 11,558,049 B2
(45) Date of Patent: Jan. 17, 2023

(54) BIAS CIRCUIT AND ELECTRONIC CIRCUIT

(71) Applicant: Murata Manufacturing Co., Ltd., Kyoto (JP)

(72) Inventors: Hideyo Yamashiro, Kyoto (JP); Takayuki Kawano, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/212,135

(22) Filed: Mar. 25, 2021

(65) Prior Publication Data

US 2021/0218395 A1 Jul. 15, 2021

Related U.S. Application Data

(63) Continuation of application No. PCT/JP2019/037992, filed on Sep. 26, 2019.

(30) Foreign Application Priority Data

Sep. 28, 2018 (JP) .............................. JP2018-185046

(51) Int. Cl.
 *H03K 17/60* (2006.01)
(52) U.S. Cl.
 CPC ..................... *H03K 17/60* (2013.01)
(58) Field of Classification Search
 CPC ...... H03K 17/60; H03F 2200/105; H03F 1/30
 See application file for complete search history.

(56) References Cited

U.S. PATENT DOCUMENTS

| 9,450,568 B1* | 9/2016 | Hawkins | ............... H03K 17/162 |
| 2015/0365060 A1* | 12/2015 | Tsunetsugu | ............... H03F 3/08 |
| | | | 250/214 A |
| 2016/0190992 A1* | 6/2016 | Ridgers | ..................... H03F 3/19 |
| | | | 330/296 |
| 2019/0097022 A1* | 3/2019 | Kim | ..................... H01L 29/0817 |

FOREIGN PATENT DOCUMENTS

| JP | S56-143022 A | 11/1981 |
| JP | 2009-087010 A | 4/2009 |
| JP | 2014-241091 A | 12/2014 |
| JP | 2017-005063 A | 1/2017 |

OTHER PUBLICATIONS

International Search Report for PCT/JP2019/037992 dated Oct. 21, 2019.
Written Opinion for PCT/JP2019/037992 dated Oct. 21, 2019.

* cited by examiner

*Primary Examiner* — Sibin Chen
(74) *Attorney, Agent, or Firm* — Pearne & Gordon LLP

(57) ABSTRACT

A bias circuit supplies bias voltage to a linear detector circuit. The bias circuit includes a transistor including a collector terminal, an emitter terminal, and a base terminal; a resistance element having one end connected to the collector terminal and the other end connected to a power line and the base terminal; a resistance element having one end connected to the emitter terminal; a transistor that switches between connection and disconnection between the resistance element and ground; collector voltage extended lines that transmit voltage corresponding to collector voltage as the bias voltage; and a transistor that is arranged on a path of one of the collector voltage extended lines and that switches between connection and disconnection between an output terminal of the linear detector circuit and the collector terminal.

10 Claims, 8 Drawing Sheets

BIAS CIRCUIT AND ELECTRONIC CIRCUIT

CROSS REFERENCE TO RELATED APPLICATION

This is a continuation of International Application No. PCT/JP2019/037992 filed on Sep. 26, 2019 which claims priority from Japanese Patent Application No. 2018-185046 filed on Sep. 28, 2018. The contents of these applications are incorporated herein by reference in their entireties.

BACKGROUND

Technical Field

The present disclosure relates to a bias circuit and an electronic circuit including the bias circuit.

Patent Document 1 discloses the configuration of a regulator circuit including a depletion field effect transistor (FET) in which the drain terminal is connected to a power supply terminal, the source terminal is connected to an output voltage terminal, and the gate terminal is grounded via a diode. With this configuration, output voltage that is not affected by variation in power supply voltage is capable of being output while the FET is turned on or off in response to a control signal supplied to the gate terminal.

Patent Document 1: Japanese Unexamined Patent Application Publication No. 2017-5063

BRIEF SUMMARY

Connecting the regulator circuit disclosed in Patent Document 1 to an external circuit enables the regulator circuit to be used as a bias circuit with low power consumption capable of supplying to the external circuit the output voltage (bias voltage), which is not affected by the variation in the power supply voltage.

However, if threshold value voltage Vth between the gate terminal and the source terminal of the FET is varied for each FET when the regulator circuit disclosed in Patent Document 1 is used as the bias circuit, the bias voltage is varied for each bias circuit. In other words, stable bias voltage may not be supplied in mass-produced products of the bias circuit. In addition, since an output signal output from the external circuit is also varied due to variation in the bias voltage, stable performance may not be achieved in the mass-produced products of the electronic circuit including the bias circuit and the external circuit.

The present disclosure provides a bias circuit capable of supplying stable bias voltage and an electronic circuit including the bias circuit.

A bias circuit according to an aspect of the present disclosure supplies bias voltage to an external circuit. The bias circuit includes a first bipolar transistor including a collector terminal, an emitter terminal, and a base terminal; a first resistance element having one end connected to the collector terminal and the other end connected to a power line and the base terminal; a second resistance element having one end connected to the emitter terminal; a first switch transistor that is arranged between the other end of the second resistance element and ground and that switches between connection and disconnection between the second resistance element and the ground; a collector voltage extended line that at least includes a path connecting the collector terminal to the external circuit and that transmits voltage corresponding to collector voltage of the collector terminal as the bias voltage; and a second switch transistor that is arranged on a path of the collector voltage extended line and that switches between connection and disconnection between an output terminal of the external circuit and the collector terminal.

A bias circuit according to an aspect of the present disclosure supplies bias voltage to an external circuit. The bias circuit includes a first bipolar transistor including a collector terminal, an emitter terminal, and a base terminal; a first resistance element having one end connected to the collector terminal and the other end connected to a power line; a second resistance element having one end connected to the emitter terminal and the other end that is grounded; a first switch transistor that is arranged between the base terminal and the other end of the first resistance element and that switches between connection and disconnection between the base terminal and the power line; a collector voltage extended line that at least includes a path connecting the collector terminal to the external circuit and that transmits voltage corresponding to collector voltage of the collector terminal as the bias voltage; and a second switch transistor that is arranged on a path of the collector voltage extended line and that switches between connection and disconnection between an output terminal of the external circuit and the collector terminal.

A bias circuit according to an aspect of the present disclosure supplies bias voltage to an external circuit. The bias circuit includes a first bipolar transistor including a collector terminal, an emitter terminal, and a base terminal; a first resistance element having one end connected to the collector terminal and the other end connected to a power line; a second bipolar transistor that is arranged on a path connecting the first resistance element to ground and that includes a collector terminal, an emitter terminal, and a base terminal; a second resistance element having one end connected to the emitter terminal of the second bipolar transistor and the other end that is grounded; a first switch transistor that is arranged between the base terminal of the second bipolar transistor and the collector terminal of the second bipolar transistor and that switches between connection and disconnection between the base terminal of the second bipolar transistor and the collector terminal of the second bipolar transistor; a collector voltage extended line that at least includes a path connecting the collector terminal of the second bipolar transistor to the external circuit and that transmits voltage corresponding to collector voltage of the collector terminal as the bias voltage; and a second switch transistor that is arranged on a path of the collector voltage extended line and that switches between connection and disconnection between an output terminal of the external circuit and the collector terminal of the second bipolar transistor.

A bias circuit according to an aspect of the present disclosure supplies bias voltage to an external circuit. The bias circuit includes a first bipolar transistor including a collector terminal, an emitter terminal, and a base terminal; a first resistance element having one end connected to the collector terminal and the other end connected to the base terminal; a second resistance element having one end connected to the emitter terminal and the other end that is grounded; a first switch transistor that is arranged between the other end of the first resistance element and a power line and that switches between connection and disconnection between the first resistance element and the power line; and a collector voltage extended line that at least includes a path connecting the collector terminal to the external circuit and that transmits voltage corresponding to collector voltage of the collector terminal as the bias voltage.

According to the present disclosure, it is possible to provide a bias circuit capable of supplying stable bias voltage and an electronic circuit including the bias circuit.

DETAILED DESCRIPTION

Figure 1A:
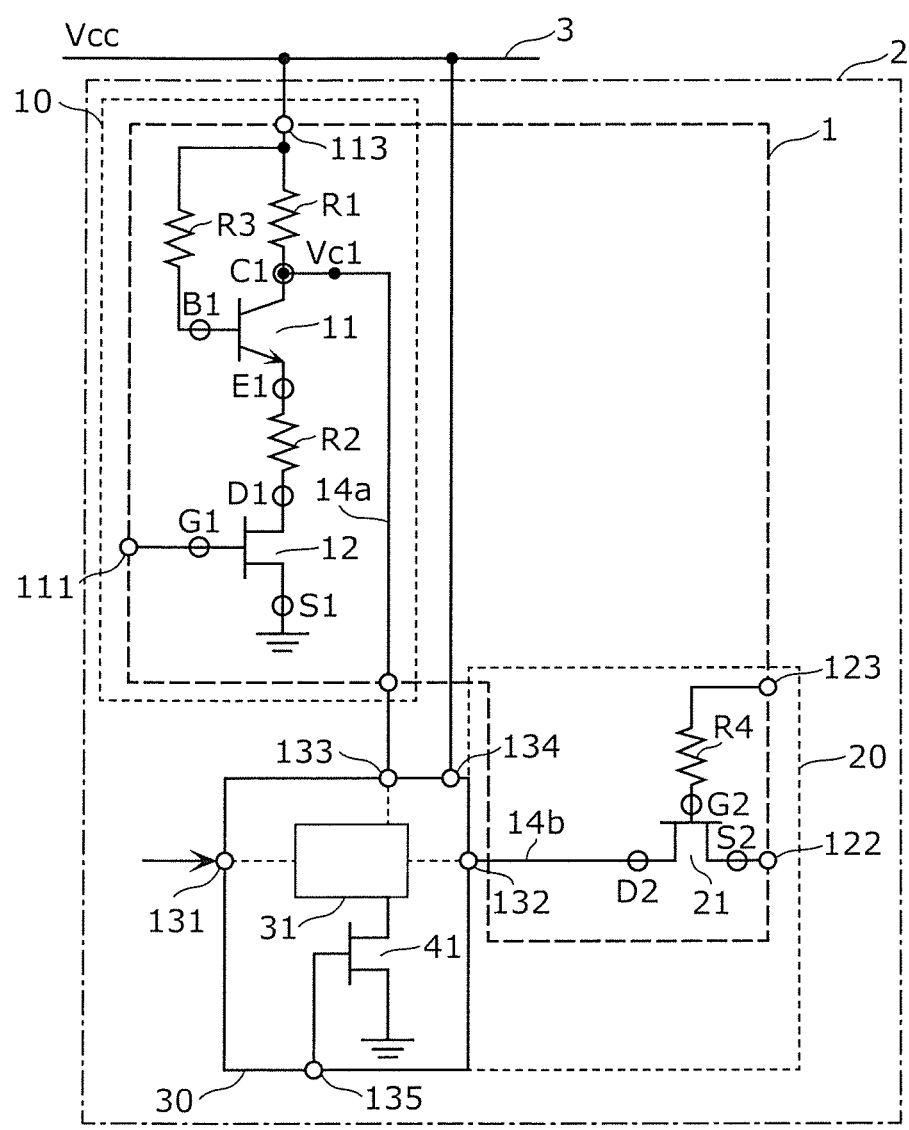
FIG. 1A is a circuit configuration diagram of a bias circuit and an electronic circuit according to an embodiment.

Embodiments of the present disclosure will herein be described in detail using the embodiments with reference to the drawings. All the embodiments described below indicate comprehensive or specific examples. Numerical values, shapes, materials, components, the arrangement of the components, the connection mode of the components, and so on, which are indicated in the embodiments described below, are only examples and are not intended to limit the present disclosure. Among the components in the embodiments described below, the components that are not described in the independent claims are described as optional components. In addition, the sizes or the ratios of the sizes of the components illustrated in the drawings are not necessarily strictly indicated.

EMBODIMENT

FIG. 1A is a circuit configuration diagram of a bias circuit 1 and an electronic circuit 2 according to an embodiment. As illustrated in FIG. 1, the electronic circuit 2 includes the bias circuit 1 and a linear detector circuit 30. The bias circuit 1 is a circuit that supplies bias voltage to the linear detector circuit 30. The linear detector circuit 30 is an external circuit that receives the bias voltage when the linear detector circuit 30 is viewed from the bias circuit 1. The external circuit is not limited to the linear detector circuit and may be another circuit, such as a normal detector circuit.

The linear detector circuit 30 has an input terminal 131, an output terminal 132, a bias terminal 133, a power supply terminal 134, and a detection unit 31. The linear detector circuit 30 receives, for example, a radio-frequency signal through the input terminal 131 and receives the bias voltage from the bias circuit 1 through the bias terminal 133. The detection unit 31 is, for example, a processing circuit that performs half wave rectification to the radio-frequency signal input through the input terminal 131 and that generates direct-current voltage corresponding to the power of the radio-frequency signal and the bias voltage from a direct-current signal corresponding to the power of the radio-frequency signal converted through the half wave rectification and the bias voltage supplied through the bias terminal 133. The detection unit 31 outputs the direct-current voltage through the output terminal 132. Although power supply voltage is supplied to the power supply terminal 134 in the linear detector circuit 30, the power supply terminal 134 may not be provided if the power supply voltage is not necessary for the operation of the detection unit 31.

The bias circuit 1 includes transistors 11, 12, and 21, resistance elements R1, R2, R3, and R4, and collector voltage extended lines 14a and 14b.

The transistors 11 and 12, the resistance elements R1, R2, and R3, and the collector voltage extended line 14a compose an input-side circuit 10 arranged at the bias voltage input side of the linear detector circuit 30. The resistance element R4, the transistor 21, and the collector voltage extended line 14b compose an output-side circuit 20 arranged at the output side of the linear detector circuit 30.

The transistor 11 is a first bipolar transistor including a base terminal B1, a collector terminal C1, and an emitter terminal E1.

The resistance element R1 is a first resistance element having one end connected to the collector terminal C1 and the other end that is connected to a power line 3 via a power input terminal 113 and that is connected to the base terminal B1 via the resistance element R3.

The resistance element R2 is a second resistance element having one end connected to the emitter terminal E1. The other end of the resistance element R2 is connected to a drain terminal D1 of the transistor 12.

The resistance element R3 is a third resistance element having one end connected to the base terminal B1 and the other end connected to the other end of the resistance element R1. In other words, the resistance element R3 is the third resistance element arranged in series on the path connecting the base terminal B1 to the other end of the resistance element R1.

The transistor 12 is a first switch transistor that is arranged between the other end of the resistance element R2 and ground and that switches between connection and disconnection between the resistance element R2 and the ground. The transistor 12 is, for example, an n-type field effect transistor (FET) including a gate terminal G1, the drain terminal D1, and a source terminal S1. More specifically, the drain terminal D1 is connected to the other end of the resistance element R2, the source terminal S1 is grounded, and the gate terminal G1 is connected to a control signal terminal 111. The transistor 12 may be a p-type FET.

The collector voltage extended line 14a is a signal line connecting the collector terminal C1 to the bias terminal 133 of the linear detector circuit 30 and transmits collector voltage Vc1 of the collector terminal C1 to the linear detector circuit 30 as the bias voltage. The collector voltage extended line 14b is a signal line connecting the output terminal 132 of the linear detector circuit 30 to an output terminal 122 of the bias circuit 1 and transmits the direct-current voltage corresponding to the power of the radio-frequency signal and the collector voltage Vc1 to the output terminal 122. In other words, the collector voltage extended lines 14a and 14b compose a collector voltage extended line that at least includes the path connecting the collector terminal C1 to the linear detector circuit 30 and that transmits the voltage corresponding to the collector voltage Vc1 of the collector terminal C1 to the linear detector circuit 30 as the bias voltage. The voltage corresponding to the collector voltage Vc1 here means the collector voltage Vc1 itself and the voltage output from the external circuit to which the collector voltage Vc1 is supplied as the bias voltage.

In the bias circuit 1 according to the present embodiment, the output terminal 122 functions as an output terminal that outputs the direct-current voltage generated in the linear detector circuit 30.

The transistor 21 is a second switch transistor that is arranged on the path of the collector voltage extended line 14b and that switches between connection and disconnection between the output terminal 122 and the collector terminal C1. The transistor 21 is, for example, an n-type FET including a gate terminal G2, a drain terminal D2, and a source terminal S2. More specifically, the drain terminal D2 is connected to the output terminal 132, the source terminal S2 is connected to the output terminal 122, and the gate terminal G2 is connected to a control signal terminal 123 via the resistance element R4. The use of the FETs as the transistors 12 and 21 enables the bias circuit 1 to operate with lower power consumption, compared with a case in which the bipolar transistors are used as the transistors 12 and 21.

With the above configuration of the bias circuit 1 according to the present embodiment, the base terminal B1 and the collector terminal C1 of the transistor 11 are connected to the power line 3, which supplies power supply voltage Vcc, via the resistance element (R1 or R3), and the emitter terminal E1 thereof is grounded via the resistance element R2 and the transistor 12. Accordingly, the bias circuit 1 is not affected by variation in threshold value voltage of the transistor 11 composing the bias circuit 1 and is capable of supplying the collector voltage Vc1, in which variation between mass-produced products of the bias circuit 1 is suppressed, to the linear detector circuit 30 as the bias voltage.

Supply of the stable collector voltage Vc1, which does not depend on the threshold value voltage of the transistor 11, to the linear detector circuit 30 due to the above configuration of the bias circuit 1 will now be described with reference to a bias circuit 500 and an electronic circuit 600 according to a comparative example.

Figure 2:
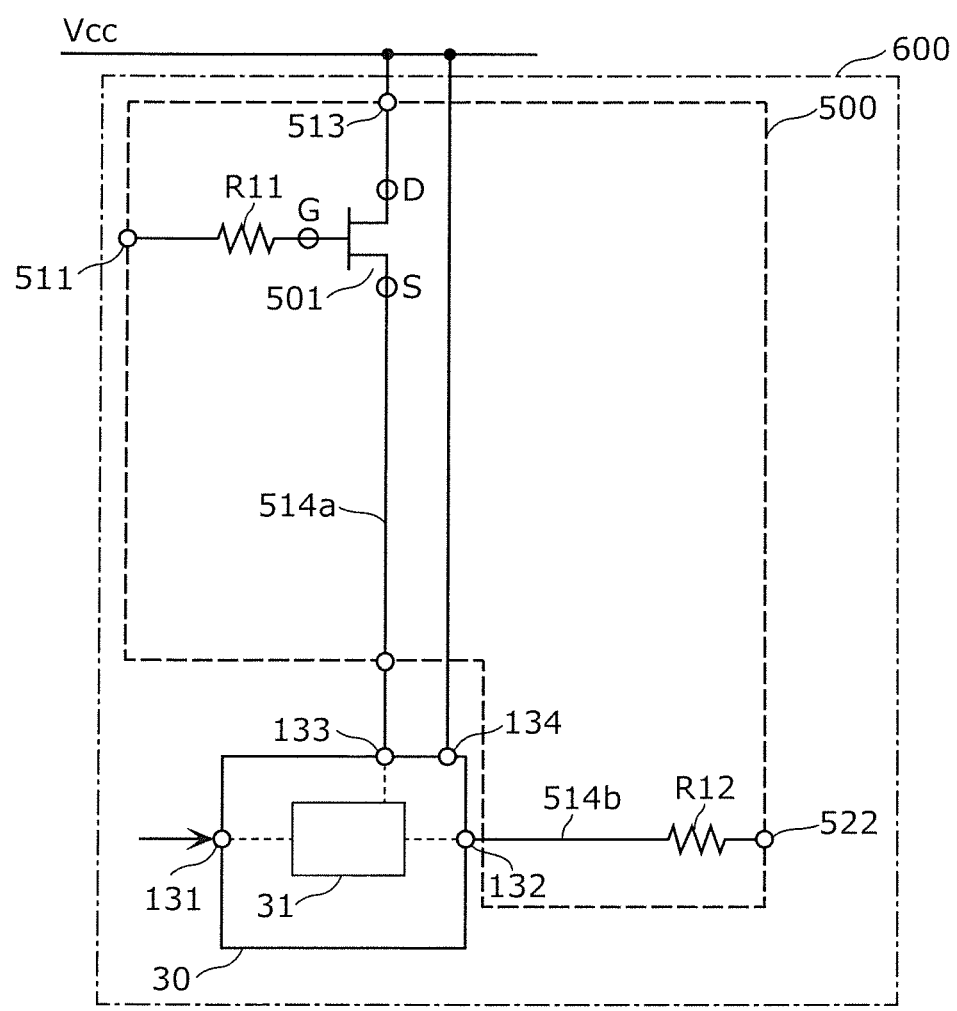
FIG. 2 is a circuit configuration diagram of a bias circuit and an electronic circuit according to a comparative example.

FIG. 2 is a circuit configuration diagram of the bias circuit 500 and the electronic circuit 600 according to the comparative example. The bias circuit 500 and the electronic circuit 600 according to the comparative example, illustrated in FIG. 2, correspond to a bias circuit and an electronic circuit in related art. The FET is used as a transistor 501 that generates the bias voltage to be supplied to the linear detector circuit 30. The electronic circuit 600 according to the comparative example differs from the electronic circuit 2 according to the embodiment only in the configuration of the bias circuit 500. Accordingly, the following description focuses on the bias circuit 500, among the bias circuit 500 and the electronic circuit 600 according to the comparative example.

The bias circuit 500 includes the transistor 501, resistance elements R11 and R12, and source voltage extended line 514a and 514b.

The transistor 501, the resistance element R11, and the source voltage extended line 514a compose an input-side circuit arranged at the bias voltage input side of the linear detector circuit 30. The resistance element R12 and the source voltage extended line 514b compose an output-side circuit arranged at the output side of the linear detector circuit 30.

The transistor 501 is an n-type depletion FET including a gate terminal G, a drain terminal D, and a source terminal S. The drain terminal D is connected to a power line via a power input terminal 513.

One end of the resistance element R11 is connected to the gate terminal G and the other end thereof is connected to a control signal terminal 511.

The source voltage extended line 514a is a signal line connecting the source terminal S to the bias terminal 133 of the linear detector circuit 30 and transmits source voltage Vs of the source terminal S to the linear detector circuit 30 as the bias voltage. The source voltage extended line 514b is a signal line connecting the output terminal 132 of the linear detector circuit 30 to an output terminal 522 of the bias circuit 500 and transmits the direct-current voltage corresponding to the power of the radio-frequency signal and the source voltage Vs (the bias voltage) to the output terminal 522. Accordingly, the source voltage extended lines 514a and 514b compose a source voltage extended line that at least includes the path connecting the source terminal S to the linear detector circuit 30 and that transmits the source voltage Vs of the source terminal S to the linear detector circuit 30 as the bias voltage.

With the above configuration of the bias circuit 500 according to the comparative example, the voltage resulting from subtraction of threshold value voltage Vth between the gate terminal and the source terminal S of the transistor 501 from on voltage (Vgon) of the transistor 501, which is a control signal applied to the control signal terminal 511, is the source voltage Vs (=Vgon−Vth). Since the transistor 501 is a depletion FET, the threshold value voltage Vth has a negative voltage value. Accordingly, the source voltage Vs can have a voltage value higher than that of the on voltage (Vgon) applied to the control signal terminal 511. In other words, the use of the depletion FET as the transistor 501 in the bias circuit 500 enables the relatively high bias voltage (source voltage Vs) to be supplied to the linear detector circuit 30.

However, since Vs=Vgon−Vth, as described above, when the source voltage Vs of the n-type FET is used as the bias voltage, the source voltage Vs is varied for each bias circuit 500 if the threshold value voltage Vth is varied for each FET. In other words, the stable bias voltage (source voltage Vs) may not be supplied in mass-produced products of the bias circuit 500. In addition, since output voltage output from the linear detector circuit 30 is also varied due to the variation in the bias voltage (the source voltage Vs), stable performance may not be achieved in mass-produced products of the electronic circuit 600.

In contrast, the bipolar transistor 11 composing the bias circuit 1 according to the present embodiment is a current-driven transistor. Collector current Ic flowing from the collector terminal C1 to the emitter terminal E1 is defined by collector current Ic=β×Ib, where Ib denotes base current flowing between the base terminal B1 and the emitter terminal E1 and β denotes a current amplification factor. Here, when the transistor 12 is in a conducting state in the circuit configuration in FIG. 1A, the collector voltage Vc1, which is the bias voltage to be supplied to the linear detector circuit 30, is stable constant voltage represented by Vc1=Vcc−R1×Ic. In other words, the collector voltage Vc1 is a linear function using the collector current Ic as a variable and the collector voltage Vc1 is the constant voltage when the collector current Ic has a constant value.

In other words, since the collector current Ic is determined by the base current and the current amplification factor β in the bias circuit 1 according to the present embodiment, the collector current Ic is inhibited from being varied depending on the threshold value voltage of the transistor 11. Accordingly, the collector voltage Vc1, which is a function of the collector current Ic, is also inhibited from being varied depending on the threshold value voltage of the transistor.

In addition, the stable collector voltage Vc1 is capable of being supplied in the bias circuit 1 according to the present embodiment even if the collector current Ic is temporally varied due to various factors. This will now be described.

First, it is assumed that the collector current Ic flowing through the transistor 11 is made greater than collector current Ics, which is the reference value (setting value). In this case, the collector current Ic also flows through the resistance element R2, voltage $V_{R2}$ applied to the resistance element R2 is increased, and the potential of the emitter terminal E1 is increased. At this time, the potential of the base terminal B1 is also increased because the emitter terminal E1 has high potential. When the potential of the base terminal B1 is increased, voltage $V_{R3}$ applied to the resistance element R3 is decreased. When the voltage $V_{R3}$ is decreased, the base current Ib flowing through the resistance element R3 is decreased. At this time, the collector current Ic corresponding to the base current Ib operates in a direction in which the collector current Ic is decreased. In contrast, when the collector current Ic is made smaller than the collector current Ics, which is the reference value (setting value), the operation opposite to the above operation is carried out and the collector current Ic operates in a direction in which the collector current Ic is increased. In other words, repetition of the above operation causes the collector current Ic to converge into the collector current Ics, which is the reference value (setting value). Accordingly, the stable collector current Ic is caused to flow without necessarily being affected by the threshold value voltage of the transistor 11. As a result, the collector voltage Vc1 is made stable constant voltage, which is calculated by Vcc−R1×Ic.

The transistor 11 may be, for example, a heterojunction bipolar transistor (HBT). In this case, since the threshold value voltage Vth is made higher, compared with those of other transistors, such as the FET, the collector voltage Vc1 is capable of being adjusted in a wider range.

Since the FETs are used as the transistors 12 and 21 in the present embodiment, the operation with low power consumption is enabled, compared with a case in which the bipolar transistors are used as the transistors 12 and 21.

In the bias circuit 1 according to the present embodiment, the resistance elements R3 and R4 are optional components. However, even if static electricity enters from the power line 3, electrostatic damage of the transistor 11 is capable of being avoided (electrostatic discharge (ESD) protection) because of the arrangement of the resistance element R3. In addition, the resistance element R4 suppresses flowing of excess current from the control signal terminal 123 to the transistor 21.

The linear detector circuit 30 may not be a linear detector circuit that detects the power of the radio-frequency signal as the direct-current voltage, and it is sufficient for the linear detector circuit 30 to be a circuit that outputs the output voltage in response to supply of the bias voltage. Specifically, it is sufficient for the electronic circuit 2 to include the bias circuit 1 and the circuit that outputs the output voltage in response to supply of the bias voltage from the bias circuit 1.

Although the transistor 21 is arranged on the path of the collector voltage extended line 14b, the transistor 21 may be arranged on the path of the collector voltage extended line 14a.

The bias circuit 1 according to the present embodiment is capable of switching between supply and non-supply of the bias voltage (the collector voltage Vc1) to the linear detector circuit 30 depending on whether the transistor 12 is in the conducting state or a non-conducting state. When the transistor 12 is in the non-conducting state, the voltage of the collector terminal C1 is the power supply voltage Vcc and the power supply voltage Vcc is supplied to the linear detector circuit 30. Accordingly, the power supply voltage Vcc may be output through the output terminal 132 via the collector voltage extended lines 14a and 14b depending on the circuit configuration of the detection unit 31. In other words, even in a period in which the supply of the bias voltage is not necessary and in a case in which the output of an output signal from the linear detector circuit 30 is not necessary, the power supply voltage Vcc is output as the output signal.

In contrast, in the configuration of the bias circuit 1 according to the present embodiment, the transistor 21, which switches between connection and disconnection between the output terminal 122 and the collector terminal C1, is further arranged on the path of the collector voltage extended line 14b. Accordingly, the output of the power supply voltage Vcc as the output signal from the linear detector circuit 30 is capable of being avoided by disconnecting the path.

Specifically, the transistor 21 is in the conducting state when the transistor 12 is in the conducting state and the transistor 21 is in the non-conducting state when the transistor 12 is in the non-conducting state. With this configuration, since the transistor 21 is switched between the conducting state and the non-conducting state in conjunction with the conducting state and the non-conducting state of the transistor 12, the output terminal 122 connected to the linear detector circuit 30 is in a high-impedance state when it is not necessary to supply the bias voltage from the bias circuit 1. Accordingly, unnecessary power is not consumed to achieve the low power consumption.

As described above, in the bias circuit 1 and the electronic circuit 2 according to the present embodiment, it is possible to supply the stable bias voltage from the bias circuit 1 to the linear detector circuit 30 and it is possible to avoid the output of the power supply voltage Vcc as the output signal from the linear detector circuit 30.

Further providing a transistor 41 that switches between connection and disconnection between the detection unit 31 and ground potential, in addition to the transistor 21, between the detection unit 31 and the ground potential realizes the electronic circuit 2 with lower power consumption.

Since the power supply voltage Vcc is supplied to the linear detector circuit 30 even when both of the transistors 12 and 21 are in the non-conducting state, as described above, the detection unit 31 may operate in this case. Specifically, even when the bias circuit 1 is in a stop state and no voltage is output from the output terminal 122, the linear detector circuit 30 in the electronic circuit 2 may continue operating.

The arrangement of the transistor 41 enables the switching between the operation state and the stop state of the detection unit 31 by switching between the conducting state and the non-conducting state of the transistor 41 in response to the control signal supplied through a control signal terminal 135. Specifically, setting the transistor 41 to the conducting state when the transistors 12 and 21 are in the conducting state and setting the transistor 41 to the non-conducting state when the transistors 12 and 21 are in the non-conducting state enable the linear detector circuit 30 not to consume unnecessary power to realize the electronic circuit 2 with lower power consumption.

Figure 1B:
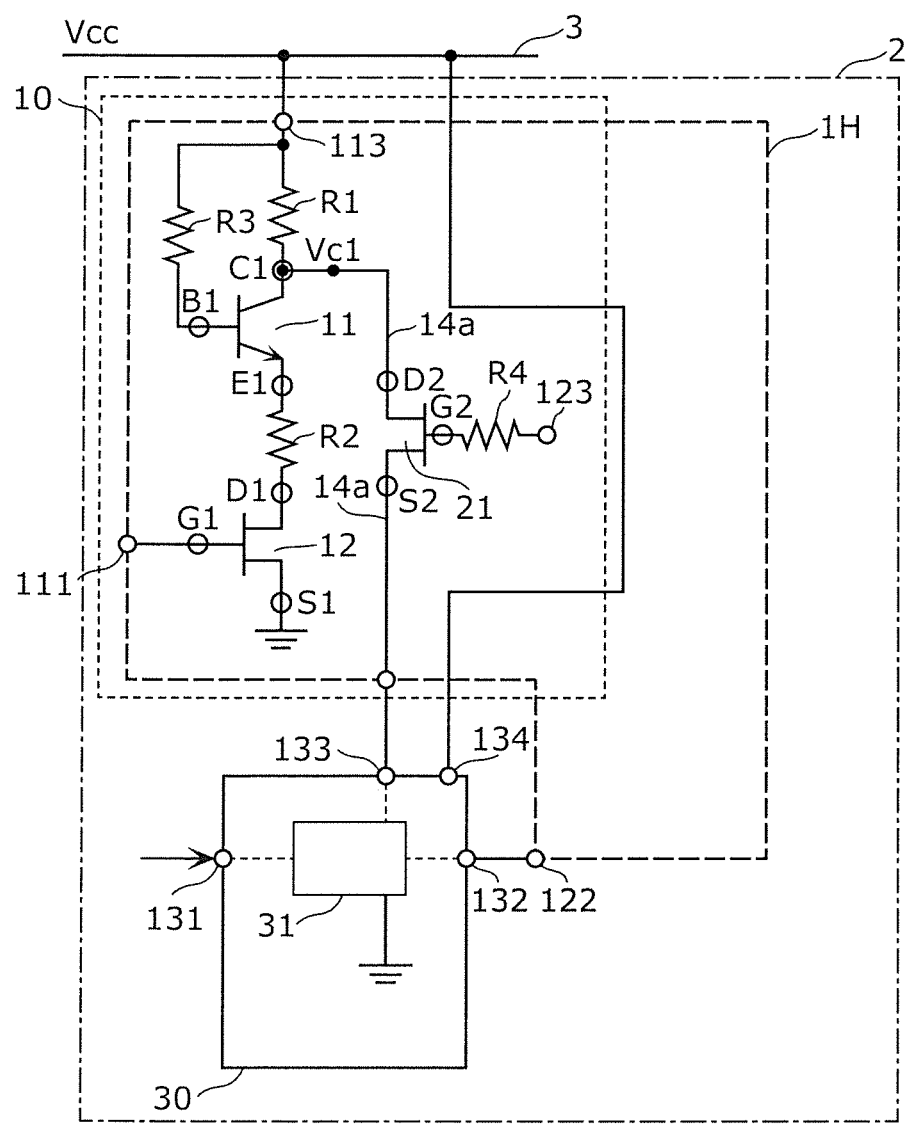
FIG. 1B is a circuit configuration diagram of a bias circuit and an electronic circuit according to a first modification of the embodiment.

When the transistor 21 is arranged on the path of the collector voltage extended line 14a, as in a bias circuit 1H illustrated in a first modification in FIG. 1B, the detection unit 31 is in the stop state by setting the transistors 12 and 21 to the non-conducting state without necessarily providing the transistor 41. Accordingly, the transistor 41 may not be provided.

Figure 3:
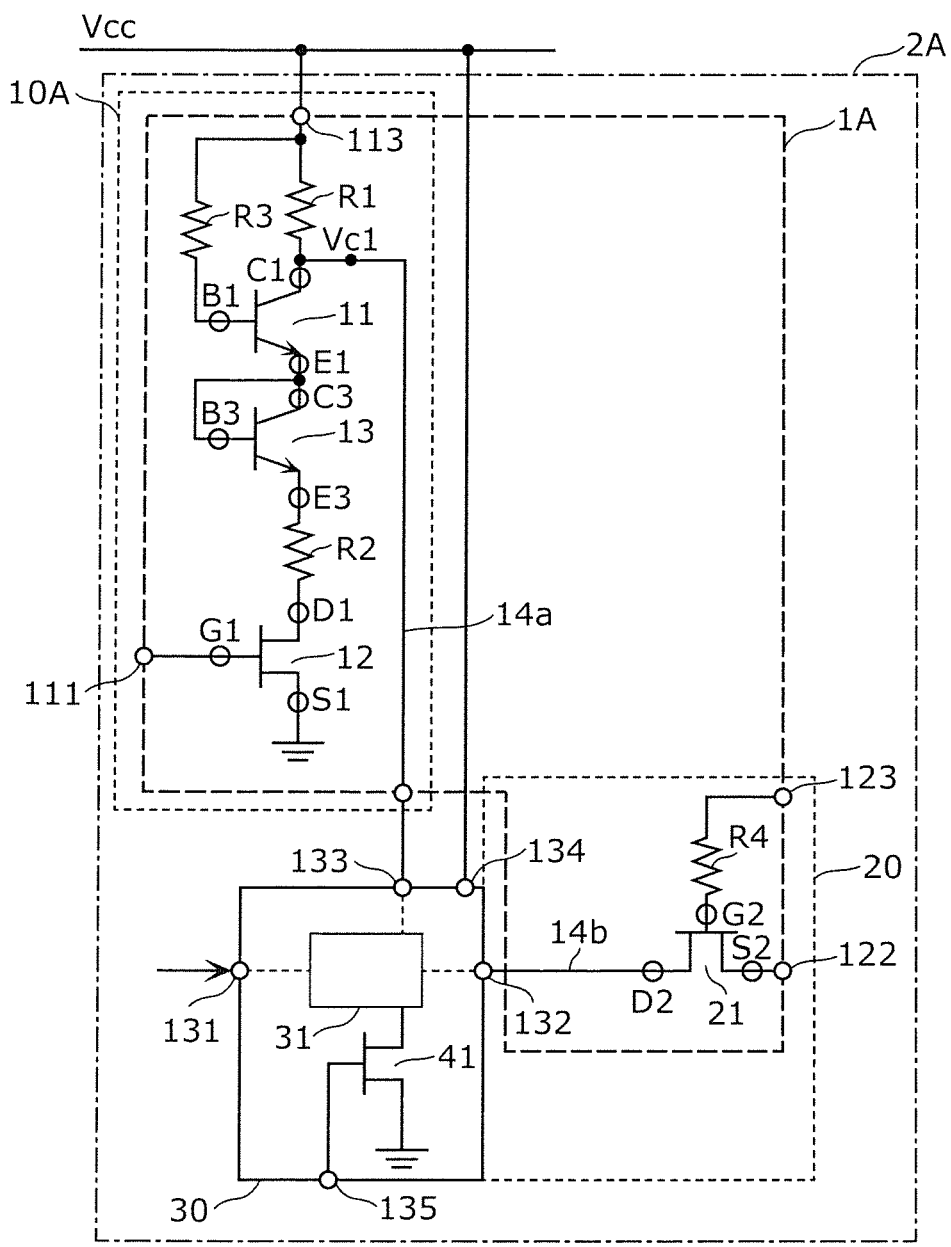
FIG. 3 is a circuit configuration diagram of a bias circuit and an electronic circuit according to a second modification of the embodiment.

FIG. 3 is a circuit configuration diagram of a bias circuit 1A and an electronic circuit 2A according to a second modification of the embodiment. As illustrated in FIG. 3, the electronic circuit 2A according to the present modification includes the bias circuit 1A and the linear detector circuit 30. The bias circuit 1A and the electronic circuit 2A according to the present modification differ from the bias circuit 1 and the electronic circuit 2 according to the embodiment only in that a diode-connected transistor 13 is added to the bias circuit 1A as the configuration. A description of the same points of the bias circuit 1A and the electronic circuit 2A according to the present modification as in the bias circuit 1 and the electronic circuit 2 according to the embodiment is omitted herein and the following description focuses on points of the bias circuit 1A and the electronic circuit 2A according to the present modification, which are different from the bias circuit 1 and the electronic circuit 2 according to the embodiment.

As illustrated in FIG. 3, the bias circuit 1A includes the transistors 11, 12, 13, and 21, the resistance elements R1, R2, R3, and R4, and the collector voltage extended lines 14a and 14b.

The transistors 11, 12, and 13, the resistance elements R1, R2, and R3, and the collector voltage extended line 14a compose an input-side circuit 10A arranged at the bias voltage input side of the linear detector circuit 30. The transistor 21, the resistance element R4, and the collector voltage extended line 14b compose the output-side circuit 20 arranged at the output side of the linear detector circuit 30.

The transistor 13 is a second bipolar transistor including a base terminal B3, a collector terminal C3, and an emitter terminal E3. The collector terminal C3 of the transistor 13 is connected to the base terminal B3, and the transistor 13 is a so-called diode-connected bipolar transistor. The collector terminal C3 is connected to the emitter terminal E1 and the emitter terminal E3 is connected to one end of the resistance element R2.

One end of the resistance element R2 is connected to the emitter terminal E3 and the other end thereof is connected to the drain terminal D1 of the transistor 12.

In other words, the transistor 13 is the diode-connected second bipolar transistor, which is arranged on the path connecting the resistance element R1 to the resistance element R2.

With the above configuration of the bias circuit 1A according to the present modification, it is possible to increase the collector voltage Vc1 supplied as the bias voltage due to the two-stage bipolar transistors 11 and 13 connected in series to each other.

The transistors 12 and 21 may be enhancement FETs. In this case, the enhancement FETs are used as the transistors 12 and 21 while not the depletion FET but the bipolar transistor is used as the transistor 11. In other words, since the depletion type is not used as the FETs and the enhancement type is used for all the FETs in the bias circuit 1A, the wafer cost for manufacturing the FETs is capable of being reduced to reduce the manufacturing cost of the electronic circuit 2A.

Figure 4:
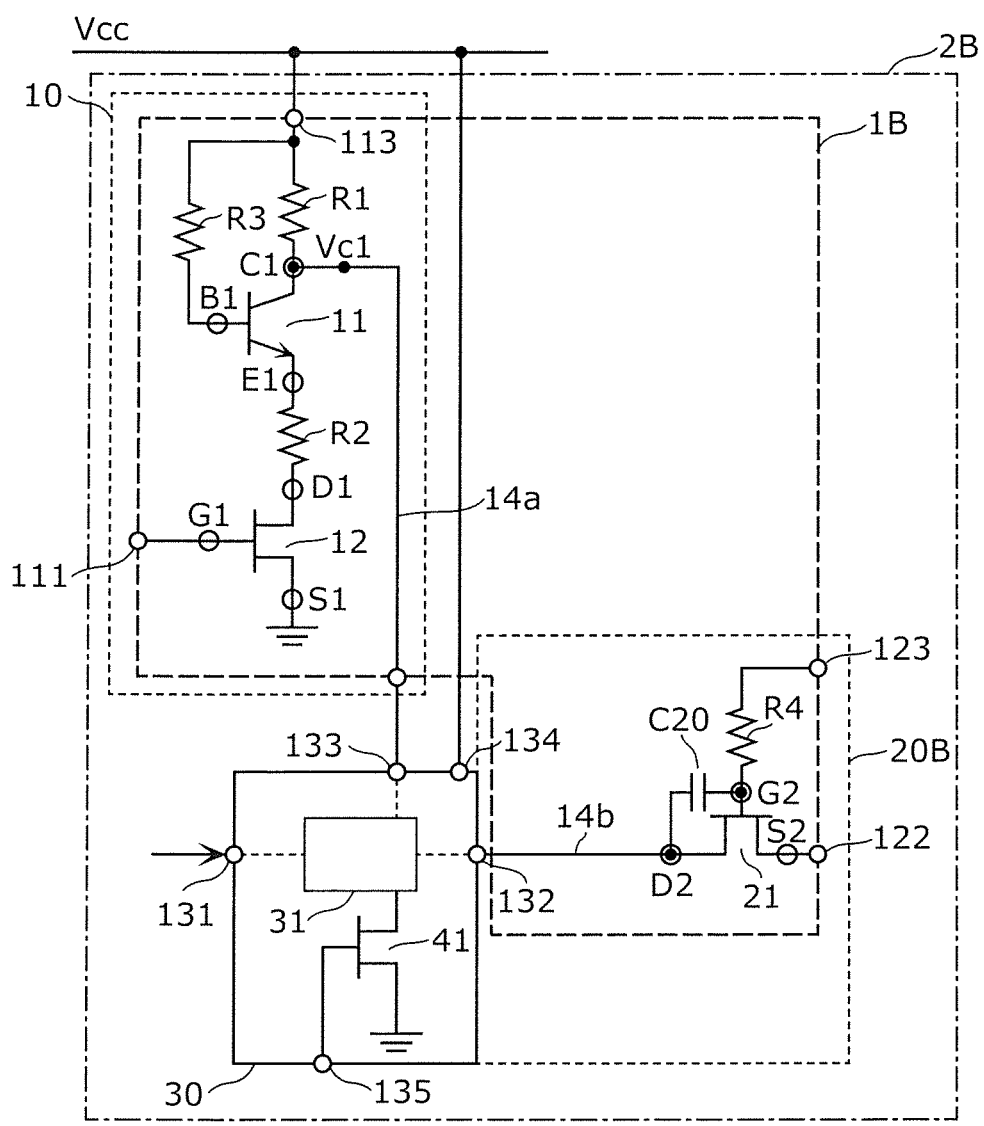
FIG. 4 is a circuit configuration diagram of a bias circuit and an electronic circuit according to a third modification of the embodiment.

FIG. 4 is a circuit configuration diagram of a bias circuit 1B and an electronic circuit 2B according to a third modification of the embodiment. As illustrated in FIG. 4, the electronic circuit 2B according to the present modification includes the bias circuit 1B and the linear detector circuit 30. The bias circuit 1B and the electronic circuit 2B according to the present modification differ from the bias circuit 1 and the electronic circuit 2 according to the embodiment only in that a capacitor C20 is added to the transistor 21 as the configuration. A description of the same points of the bias circuit 1B and the electronic circuit 2B according to the present modification as in the bias circuit 1 and the electronic circuit 2 according to the embodiment is omitted herein and the following description focuses on points of the bias circuit 1B and the electronic circuit 2B according to the present modification, which are different from the bias circuit 1 and the electronic circuit 2 according to the embodiment.

As illustrated in FIG. 4, the bias circuit 1B includes the transistors 11, 12, and 21, the resistance elements R1, R2, R3, and R4, the collector voltage extended lines 14a and 14b, and the capacitor C20.

The transistors 11 and 12, the resistance elements R1, R2, and R3, and the collector voltage extended line 14a compose the input-side circuit 10 arranged at the bias voltage input side of the linear detector circuit 30. The transistor 21, the capacitor C20, the resistance element R4, and the collector voltage extended line 14b compose an output-side circuit 20B arranged at the output side of the linear detector circuit 30.

The transistor 21 is, for example, an n-type FET.

The capacitor C20 is a capacitance element connected between the gate terminal G2 of the transistor 21 and the drain terminal D2 thereof.

With the above configuration, since the potential of the gate terminal G2 of the transistor 21 and the potential of the drain terminal D2 thereof are easily fixed owing to the capacitor C20 even if the amplitude of the radio-frequency signal input through the input terminal 131 of the linear detector circuit 30 is varied, the nonlinear operation of the transistor 21 is suppressed. Accordingly, the linearity of the characteristics of the radio-frequency signal power—the direct-current voltage output from the linear detector circuit 30 is improved. The bias circuit 1B may further include a capacitance element connected between the gate terminal G2 and the source terminal S2.

Figure 5:
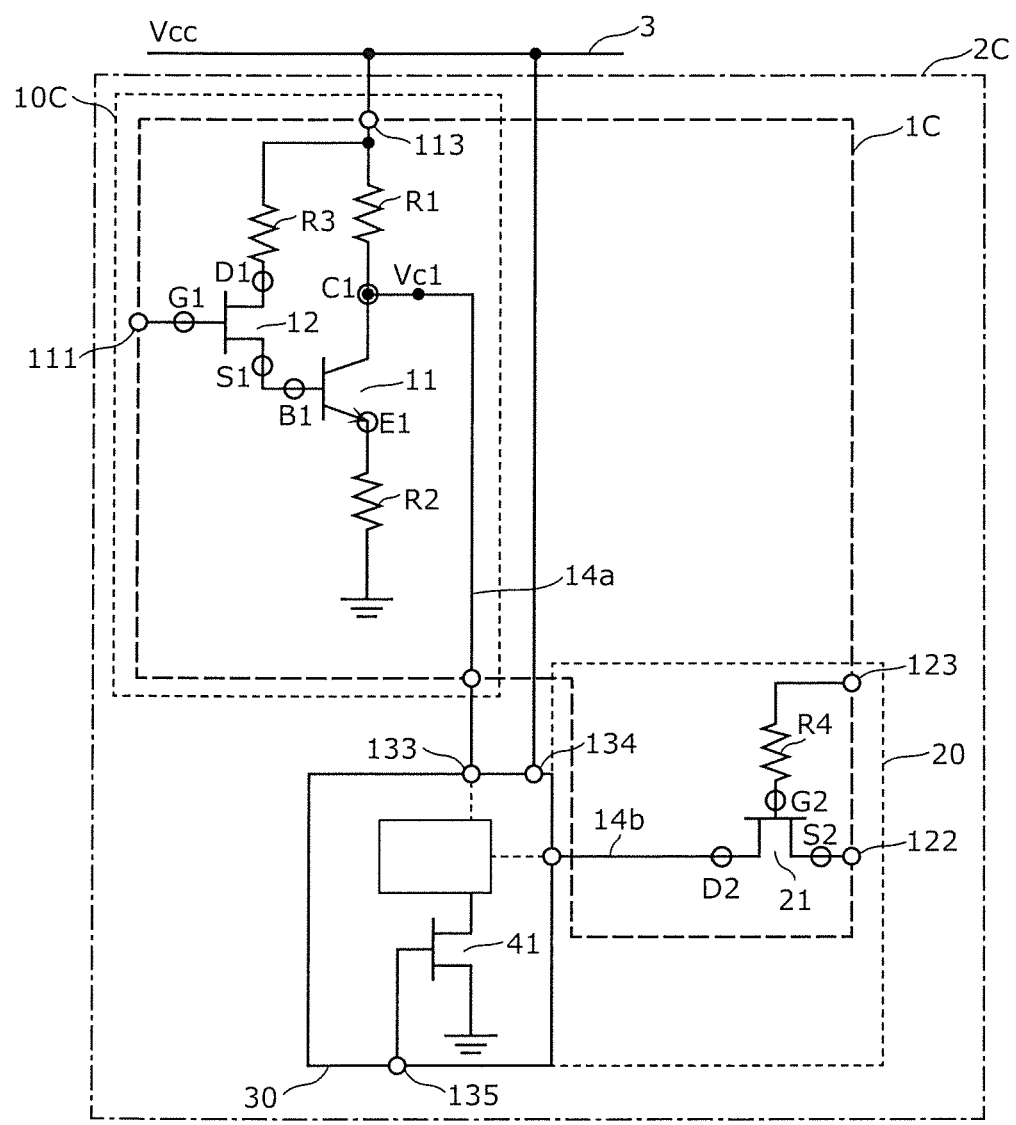
FIG. 5 is a circuit configuration diagram of a bias circuit and an electronic circuit according to a fourth modification of the embodiment.

FIG. 5 is a circuit configuration diagram of a bias circuit 1C and an electronic circuit 2C according to a fourth modification of the embodiment. As illustrated in FIG. 5, the electronic circuit 2C according to the present modification includes the bias circuit 1C and the linear detector circuit 30. The bias circuit 1C and the electronic circuit 2C according to the present modification differ from the bias circuit 1 and the electronic circuit 2 according to the embodiment only in the configuration of the bias circuit 1C. More specifically, the bias circuit 1C according to the present modification differs from the bias circuit 1 according to the embodiment in the connection configuration of the transistors 11 and 12. A description of the same points of the bias circuit 1C and the electronic circuit 2C according to the present modification as in the bias circuit 1 and the electronic circuit 2 according to the embodiment is omitted herein and the following description focuses on points of the bias circuit 1C and the electronic circuit 2C according to the present modification, which are different from the bias circuit 1 and the electronic circuit 2 according to the embodiment.

As illustrated in FIG. 5, the bias circuit 1C includes the transistors 11, 12, and 21, the resistance elements R1, R2, R3, and R4, and the collector voltage extended lines 14a and 14b.

The transistors 11 and 12, the resistance elements R1, R2, and R3, and the collector voltage extended line 14a compose an input-side circuit 10C arranged at the bias voltage input side of the linear detector circuit 30. The transistor 21, the resistance element R4 and the collector voltage extended line 14b compose the output-side circuit 20 arranged at the output side of the linear detector circuit 30.

The transistor 12 is the first switch transistor that is arranged between the base terminal B1 of the transistor 11 and one end of the resistance element R1 (the power input terminal 113) and that switches between connection and disconnection of the base terminal B1 of the transistor 11 and the one end of the resistance element R1 (the power input terminal 113). The transistor 12 is, for example, an n-type FET including the gate terminal G1, the drain terminal D1, and the source terminal S1. More specifically, the drain terminal D1 is connected to the power input terminal 113 via the resistance element R3, the source terminal S1 is connected to the base terminal B1 of the transistor 11, and the gate terminal G1 is connected to the control signal terminal 111.

One end of the resistance element R1 is connected to the power line 3 (the power input terminal 113) and is connected to the base terminal B1 of the transistor 11 via the resistance element R3, and the other end thereof is connected to the collector terminal C1 of the transistor 11.

One end of the resistance element R2 is connected to the emitter terminal E1 of the transistor 11 and the other end thereof is grounded.

The collector voltage extended line 14a is a signal line connecting the collector terminal C1 to the bias terminal 133 of the linear detector circuit 30 and transmits the collector voltage Vc1 of the collector terminal C1 to the linear detector circuit 30 as the bias voltage. The collector voltage extended line 14b is a signal line connecting the output terminal 132 of the linear detector circuit 30 to the output terminal 122 of the bias circuit 1C and transmits the direct-current voltage corresponding to the power of the radio-frequency signal and the collector voltage Vc1 to the output terminal 122. In other words, the collector voltage extended lines 14a and 14b compose a collector voltage extended line that at least includes the path connecting the collector terminal C1 to the linear detector circuit 30 and that transmits the voltage corresponding to the collector voltage Vc1 of the collector terminal C1 as the bias voltage.

In the bias circuit 1C according to the present modification, the output terminal 122 functions as an output terminal that outputs the direct-current voltage generated in the linear detector circuit 30.

With the above configuration of the bias circuit 1C according to the present modification, the base terminal B1 of the transistor 11 is connected to the power line 3, which supplies the power supply voltage Vcc, via the resistance element R3 and the transistor 12, the collector terminal C1 thereof is connected to the power line 3, which supplies the power supply voltage Vcc, via the resistance element R1, and the emitter terminal E1 thereof is grounded via the resistance element R2. Accordingly, the bias circuit 1C is not affected by the variation in the threshold value voltage of the transistor 11 composing the bias circuit 1C and is capable of stably supplying the collector voltage Vc1 of the transistor 11 to the linear detector circuit 30 as the bias voltage.

The bias circuit 1C according to the present modification is capable of switching between supply and non-supply of the bias voltage (the collector voltage Vc1) to the linear detector circuit 30 depending on whether the transistor 12 is in the conducting state or the non-conducting state. When the transistor 12 is in the non-conducting state, the voltage of the collector terminal C1 is the power supply voltage Vcc and the power supply voltage Vcc is supplied to the linear detector circuit 30.

In contrast, the transistor 21, which switches between connection and disconnection between the output terminal 122 and the collector terminal C1, is further arranged on the path of the collector voltage extended line 14b in the configuration of the bias circuit 1C according to the present modification. Accordingly, the output of the power supply voltage Vcc as the output signal from the linear detector circuit 30 is capable of being avoided by disconnecting the path. Consequently, unnecessary power is not consumed to achieve the low power consumption.

In addition, in the bias circuit 1C according to the present modification, the transistor 12 is not on the path on which the collector current of the transistor 11 flows and is arranged between the base terminal B1 of the transistor 11 and the power line 3 to switch between connection and disconnection between the base terminal B1 of the transistor 11 and the power line 3. Accordingly, even if a resistance component occurring in the conducting state of the transistor 12 is varied with variation in the temperature environment, the bias circuit 1C is less likely to be affected by the variation in the resistance component.

If the temperature environment around the transistor 12 is varied when the transistor 12 is in the conducting state, specifically, if only the transistor 12 is locally heated when the transistor 12 is in the conducting state, the resistance value of the resistance component occurring from the transistor 12 is increased to increase the amount of current flowing between the drain terminal D1 of the transistor 12 and the source terminal S1 thereof, thus increasing the potential at the drain terminal side. At this time, when the transistor 12 is arranged at the emitter terminal E1 side of the transistor 11, as in the bias circuit 1 according to the embodiment, the potential at the emitter terminal E1 side of the transistor 11 is varied to vary the current flowing between the collector terminal C1—the emitter terminal E1 of the transistor 11. As a result, the voltage output from the bias circuit 1 may also be varied. In other words, the balance of the temperature characteristics of the bias circuit 1 may be lost.

In contrast, in the bias circuit 1C according to the present modification, the transistor 12 is arranged at the base terminal B1 side (is connected to the base terminal B1) of the transistor 11. The current flowing through the base terminal of the transistor is smaller than the currents flowing through the emitter terminal and the collector terminal. Accordingly, even if the transistor 12 in the conducting state is locally heated to vary the base current, the current flowing between the collector terminal C1—the emitter terminal E1 of the transistor 11 is less likely to be varied due to the variation of the base current. In other words, with the configuration of the bias circuit 1C according to the present modification, the bias circuit the balance of the temperature characteristics of which is less likely to be lost is achieved.

Figure 6:
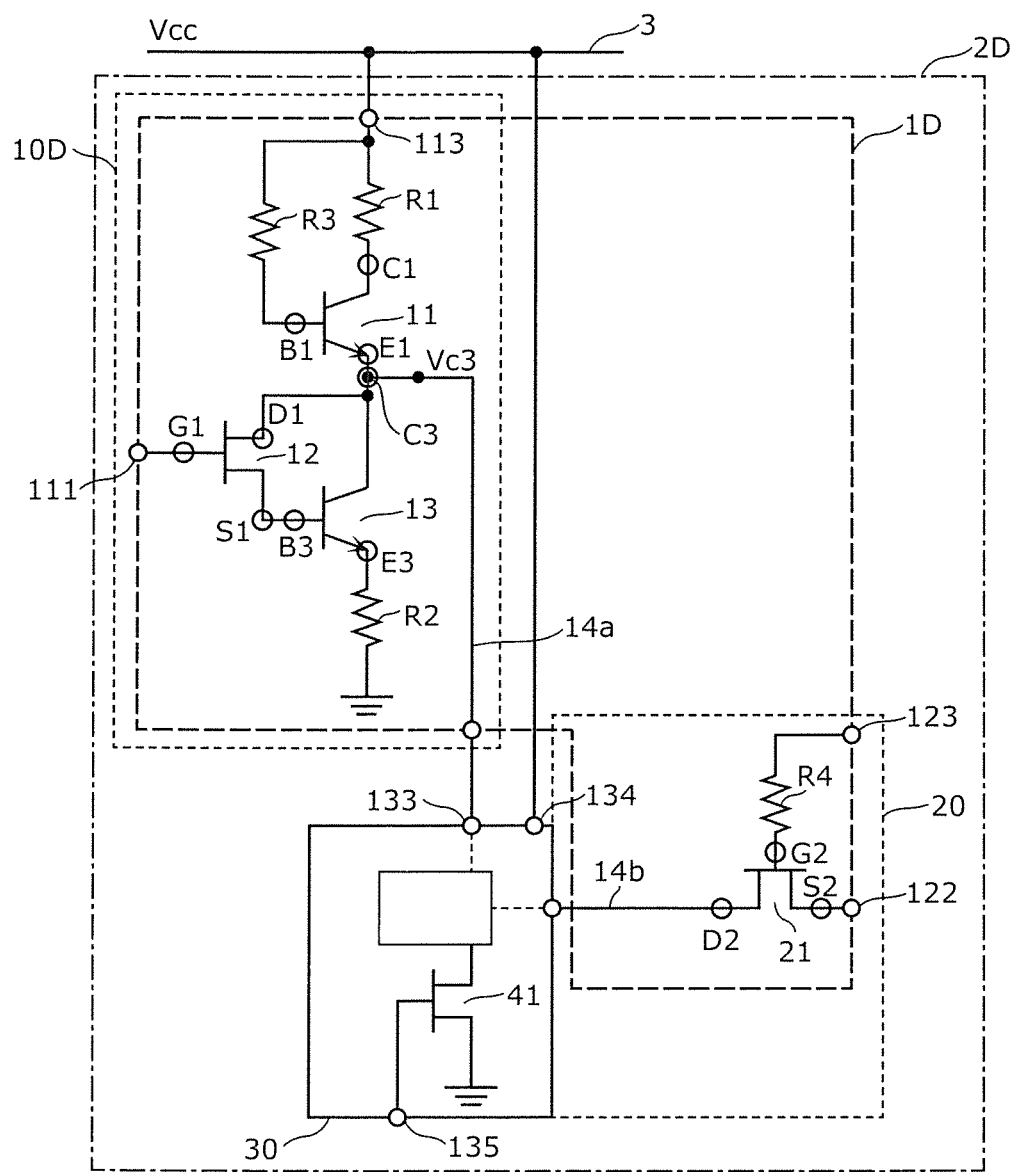
FIG. 6 is a circuit configuration diagram of a bias circuit and an electronic circuit according to a fifth modification of the embodiment.

FIG. 6 is a circuit configuration diagram of a bias circuit 1D and an electronic circuit 2D according to a fifth modification of the embodiment. As illustrated in FIG. 6, the electronic circuit 2D according to the present modification includes the bias circuit 1D and the linear detector circuit 30. The bias circuit 1D and the electronic circuit 2D according to the present modification differ from the bias circuit 1 and the electronic circuit 2 according to the embodiment in the configuration of the bias circuit 1D. More specifically, the bias circuit 1D according to the present modification differs from the bias circuit 1 according to the embodiment in the connection configuration of the transistors 11 and 12 and in that the transistor 13 is newly added. A description of the same points of the bias circuit 1D and the electronic circuit 2D according to the present modification as in the bias circuit 1 and the electronic circuit 2 according to the embodiment is omitted herein and the following description focuses on points of the bias circuit 1D and the electronic circuit 2D according to the present modification, which are different from the bias circuit 1 and the electronic circuit 2 according to the embodiment.

As illustrated in FIG. 6, the bias circuit 1D includes the transistors 11, 12, 13, and 21, the resistance elements R1, R2, R3, and R4, and the collector voltage extended lines 14a and 14b.

The transistors 11, 12, and 13, the resistance elements R1, R2, and R3, and the collector voltage extended line 14a compose an input-side circuit 10D arranged at the bias voltage input side of the linear detector circuit 30. The transistor 21, the resistance element R4, and the collector voltage extended line 14b compose the output-side circuit 20 arranged at the output side of the linear detector circuit 30.

The transistor 13 is the second bipolar transistor that is arranged on the path connecting the resistance element R1 to the ground and that includes the base terminal B3, the collector terminal C3, and the emitter terminal E3. The base terminal B3 of the transistor 13 is connected to the source terminal S1 of the transistor 12, the collector terminal C3 of the transistor 13 is connected to the emitter terminal E1 of the transistor 11, and the emitter terminal E3 of the transistor 13 is connected to one end of the resistance element R2.

The transistor 12 is the first switch transistor that is arranged between the base terminal B3 of the transistor 13 and the collector terminal C3 of the transistor 13 and that switches between connection and disconnection between the base terminal B3 of the transistor 13 and the collector terminal C3 of the transistor 13. The transistor 12 is, for example, an n-type FET including the gate terminal G1, the drain terminal D1, and the source terminal S1. More specifically, the drain terminal D1 is connected to the collector terminal C3 of the transistor 13, the source terminal S1 is connected to the base terminal B3 of the transistor 13, and the gate terminal G1 is connected to the control signal terminal 111.

One end of the resistance element R1 is connected to the power line 3 and is connected to the base terminal B1 of the transistor 11 via the resistance element R3, and the other end thereof is connected to the collector terminal C1 of the transistor 11.

In other words, the transistor 11 is the first bipolar transistor including the base terminal B1 connected to one end of the resistance element R1 via the resistance element R3, the collector terminal C1 connected to the other end of the resistance element R1, and the emitter terminal E1 connected to the collector terminal C3 of the transistor 13.

With the above configuration of the bias circuit 1D according to the present modification, it is possible to increase collector voltage Vc3 supplied as the bias voltage due to the two-stage bipolar transistors 11 and 13 connected in series to each other.

The transistors 12 and 21 may be the enhancement FETs. In this case, the enhancement FETs are used as the transistors 12 and 21 while not the depletion FET but the bipolar transistor is used as the transistor 11. In other words, since the depletion type is not used as the FETs and the enhancement type is used for all the FETs in the bias circuit 1D, the wafer cost for manufacturing the FETs is capable of being reduced to reduce the manufacturing cost of the electronic circuit 2D.

Figure 7:
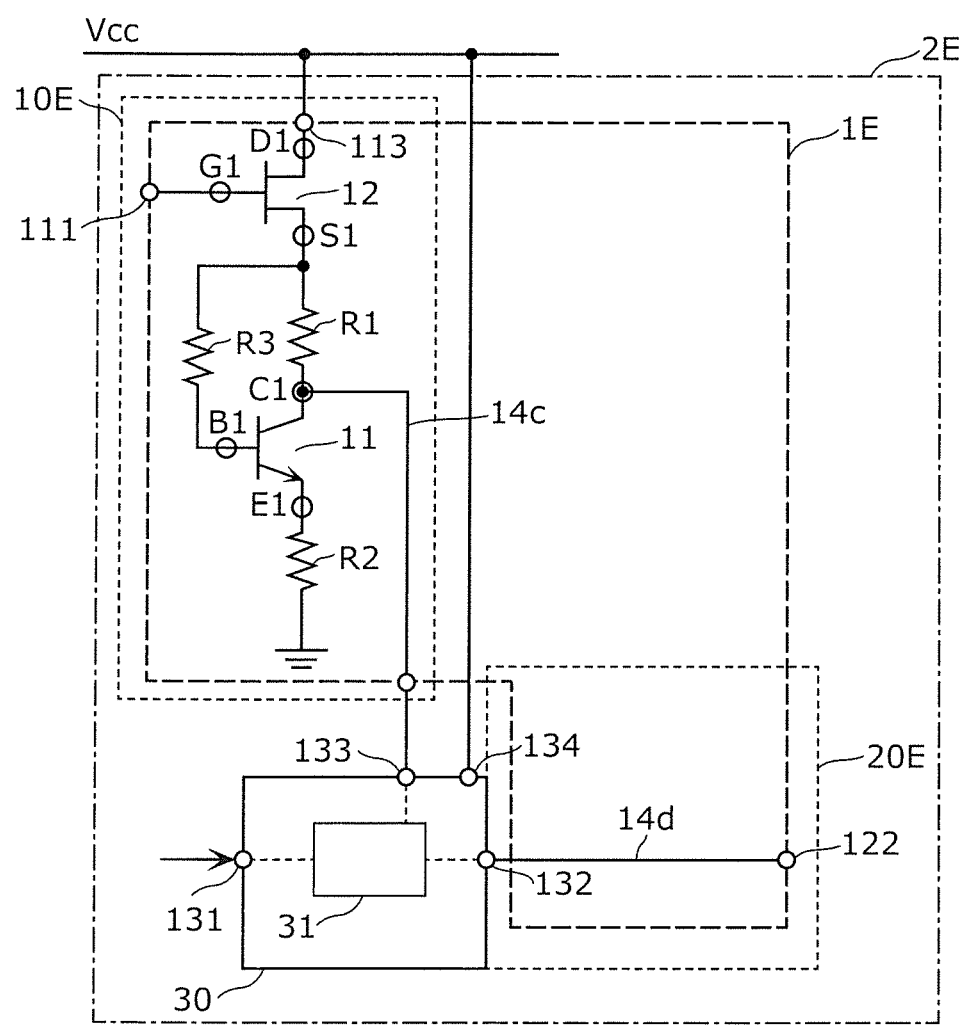
FIG. 7 is a circuit configuration diagram of a bias circuit and an electronic circuit according to a sixth modification of the embodiment.

FIG. 7 is a circuit configuration diagram of a bias circuit 1E and an electronic circuit 2E according to a sixth modification of the embodiment. As illustrated in FIG. 7, the electronic circuit 2E according to the present modification includes the bias circuit 1E and the linear detector circuit 30. The bias circuit 1E and the electronic circuit 2E according to the present modification differ from the bias circuit 1 and the electronic circuit 2 according to the embodiment only in the configuration of the bias circuit 1E. More specifically, the bias circuit 1E according to the present modification differs from the bias circuit 1 according to the embodiment in the connection configuration of the transistors 11 and 12 and in that the transistor 21 is not arranged. A description of the same points of the bias circuit 1E and the electronic circuit 2E according to the present modification as in the bias circuit 1 and the electronic circuit 2 according to the embodiment is omitted herein and the following description focuses on points of the bias circuit 1E and the electronic circuit 2E according to the present modification, which are different from the bias circuit 1 and the electronic circuit 2 according to the embodiment.

As illustrated in FIG. 7, the bias circuit 1E includes the transistors 11 and 12, the resistance elements R1, R2, and R3, and collector voltage extended lines 14c and 14d.

The transistors 11 and 12, the resistance elements R1, R2, and R3, and the collector voltage extended line 14c compose an input-side circuit 10E arranged at the bias voltage input side of the linear detector circuit 30. The collector voltage extended line 14d composes an output-side circuit 20E arranged at the output side of the linear detector circuit 30.

The transistor 11 is the first bipolar transistor including the base terminal B1, the collector terminal C1, and the emitter terminal E1.

The resistance element R1 is the first resistance element having one end connected to the collector terminal C1 and the other end that is connected to the source terminal S1 of the transistor 12 and that is connected to the base terminal B1 via the resistance element R3.

The resistance element R2 is the second resistance element having one end connected to the emitter terminal E1 and the other end that is grounded.

The resistance element R3 is the third resistance element having one end connected to the base terminal B1 and the other end connected to the source terminal S1 of the transistor 12. In other words, the resistance element R3 is the third resistance element that is arranged in series on the path connecting the base terminal B1 to the source terminal S1.

The transistor 12 is the first switch transistor that is arranged between the power line 3 and the resistance element R1 and that switches between connection and disconnection between the resistance element R1 and the power line 3. The transistor 12 is, for example, an n-type FET including the gate terminal G1, the drain terminal D1, and the source terminal S1. More specifically, the drain terminal D1 is connected to the power line 3, the source terminal S1 is connected to the other end of the resistance element R1 and the other end of the resistance element R3, and the gate terminal G1 is connected to the control signal terminal 111.

The collector voltage extended line 14c is a signal line connecting the collector terminal C1 to the bias terminal 133 of the linear detector circuit 30 and transmits the collector voltage Vc1 of the collector terminal C1 to the linear detector circuit 30 as the bias voltage. The collector voltage extended line 14d is a signal line connecting the output terminal 132 of the linear detector circuit 30 to the output terminal 122 of the bias circuit 1E and transmits the direct-current voltage corresponding to the power of the radio-frequency signal and the collector voltage Vc1 to the output terminal 122. In other words, the collector voltage extended lines 14c and 14d compose a collector voltage extended line that at least includes the path connecting the collector terminal C1 to the linear detector circuit 30 and that transmits the voltage corresponding to the collector voltage Vc1 of the collector terminal C1 to the linear detector circuit 30 as the bias voltage.

In the bias circuit 1E according to the present modification, the output terminal 122 functions as an output terminal that outputs the direct-current voltage generated in the linear detector circuit 30.

With the above configuration of the bias circuit 1E according to the present modification, the base terminal B1 and the collector terminal C1 of the transistor 11 are connected to the power line 3, which supplies the power supply voltage Vcc, via the resistance element (R1 or R3) and the transistor 12 and the emitter terminal E1 thereof is grounded via the resistance element R2. Accordingly, the bias circuit 1E is not affected by the variation in the threshold value voltage of the transistor 11 composing the bias circuit 1C and is capable of stably supplying the collector voltage Vc1 of the transistor 11 to the linear detector circuit 30 as the bias voltage.

The bias circuit 1E according to the present modification is capable of switching between supply and non-supply of the bias voltage (the collector voltage Vc1) to the linear detector circuit 30 depending on whether the transistor 12 is in the conducting state or the non-conducting state. When the transistor 12 is in the non-conducting state, the voltage of the collector terminal C1 is not the power supply voltage Vcc. Accordingly, the power supply voltage Vcc is not applied to the linear detector circuit 30 and the power supply voltage Vcc is not output as the output voltage from the linear detector circuit 30. In other words, in the period in which the supply of the bias voltage is not necessary and in the case in which the output signal from the linear detector circuit 30 is not necessary, the power supply voltage Vcc is not output as the output signal.

Accordingly, with the configuration of the bias circuit 1E according to the present modification, it is possible to avoid the output of the power supply voltage Vcc as the output signal from the linear detector circuit 30. In other words, it is not necessary to provide the switch transistor in the output-side circuit 20E and the switch transistor in the linear detector circuit 30 to decrease the number of the circuit components in the bias circuit 1E. In addition, unnecessary power is not consumed to achieve the low power consumption.

Also in the bias circuit 1E according to the present modification, the diode-connected second bipolar transistor, which is arranged on the path connecting the resistance element R1 to the resistance element R2, may be additionally provided. In this case, it is possible to increase the collector voltage Vc1 supplied as the bias voltage.

OTHER EMBODIMENTS AND SO ON

Although the embodiment and the modifications of the bias circuits and the electronic circuits according to the present disclosure are described above, the bias circuits and the electronic circuits of the present disclosure are not limited to the embodiment and the modifications. Other embodiments realized by combining arbitrary components in the above embodiment and the modifications, modifications realized by making various changes supposed by a person skilled in the art to the above embodiment without necessarily departing from the spirit and scope of the present disclosure, and various devices including the bias circuit and the electronic circuit according to the present disclosure are also included in the present disclosure.

In the bias circuits and the electronic circuits according to the embodiment and the modifications, other radio-frequency circuit elements, lines, and so on may be provided between the paths with which the respective circuit elements and the signal paths disclosed in the drawings are connected.

INDUSTRIAL APPLICABILITY

The present disclosure is widely usable for, for example, an amplifier circuit as the bias circuit that supplies the stable bias voltage and the electronic circuit including the bias circuit.

REFERENCE SIGNS LIST 1, 1A, 1B, 1C, 1D, 1E, 1H, 500 bias circuit
2, 2A, 2B, 2C, 2D, 2E, 600 electronic circuit
3 power line
10, 10A, 10C, 10D, 10E input-side circuit
11, 12, 13, 21, 41, 501 transistor
14a, 14b, 14c, 14d collector voltage extended line
20, 20B, 20E output-side circuit
30 linear detector circuit
31 detection unit
111, 123, 135, 511 control signal terminal
113, 513 power input terminal
122, 132, 522 output terminal
131 input terminal
133 bias terminal
134 power supply terminal
514a, 514b source voltage extended line
B1, B3 base terminal
C1, C3 collector terminal
C20 capacitor
D, D1, D2 drain terminal
E1, E3 emitter terminal
G, G1, G2 gate terminal
R1, R11, R12, R2, R3, R4 resistance element
S, S1, S2 source terminal

The invention claimed is:
1. A bias circuit that supplies a bias voltage to an external circuit, the bias circuit comprising:
a first bipolar transistor having a collector terminal, an emitter terminal, and a base terminal;
a first resistor having a first end connected to the collector terminal of the first bipolar transistor, and a second end connected to a power line and to the base terminal of the first bipolar transistor;
a second resistor having a first end connected to the emitter terminal of the first bipolar transistor;

a first switch transistor that is between the second end of the second resistor and ground, and that is configured to selectively connect the second resistor to ground;

a collector voltage extended line that comprises a first path connecting the collector terminal of the first bipolar transistor to the external circuit, and that is configured to transmit a voltage corresponding to a collector voltage of the collector terminal of the first bipolar transistor as the bias voltage; and a second switch transistor that is in a second path of the collector voltage extended line, and that is configured to selectively connect an output terminal of the external circuit to the collector terminal of the first bipolar transistor.

2. The bias circuit according to claim 1, further comprising:

a second bipolar transistor that is diode-connected in a path connecting the first resistor to the second resistor, and wherein the first switch transistor and the second switch transistor are enhancement transistors.

3. The bias circuit according to claim 1, wherein the first bipolar transistor is a heterojunction bipolar transistor, and wherein the first switch transistor and the second switch transistor are field effect transistors.

4. The bias circuit according to claim 1, wherein the first switch transistor and the second switch transistor are enhancement transistors.

5. The bias circuit according to claim 1, wherein the second switch transistor is in a conducting state when the first switch transistor is in a conducting state, and wherein the second switch transistor is in a non-conducting state when the first switch transistor is in a non-conducting state.

6. The bias circuit according to claim 1, further comprising:

a third resistor that is in a path connecting the base terminal of the first bipolar transistor to the second end of the first resistor.

7. An electronic circuit comprising:

the bias circuit according to claim 1; and the external circuit.

8. The electronic circuit according to claim 7, further comprising:

a third switch transistor that is in a path connecting a processing circuit in the external circuit and ground, and that is configured to selectively connect the processing circuit to ground, wherein the voltage corresponding to the collector voltage is supplied to the processing circuit.

9. The electronic circuit according to claim 7, wherein the external circuit is a detector circuit that is configured to receive a radio-frequency signal and to output a direct-current signal corresponding to a power of the radio-frequency signal.

10. An electronic circuit comprising:

the bias circuit according to claim 1; and the external circuit, wherein the second switch transistor is a field effect transistor, and wherein a capacitance element is connected between a gate terminal of the second switch transistor and a drain terminal of the second switch transistor.

* * * * *